(12) United States Patent
Eckert (10) Patent No.: US 9,472,923 B2
(45) Date of Patent: Oct. 18, 2016

(54) LASER COMPONENT AND METHOD FOR THE PRODUCTION THEREOF

(71) Applicant: OSRAM Opto Semiconductors GmbH, Regensburg (DE)

(72) Inventor: Tilman Eckert, Regensburg (DE)

(73) Assignee: OSRAM Opto Semiconductor GmbH (DE)

( * ) Notice: Subject to any disclaimer, the term of this patent is extended or adjusted under 35 U.S.C. 154(b) by 0 days.

(21) Appl. No.: 14/780,846

(22) PCT Filed: Mar. 25, 2014

(86) PCT No.: PCT/EP2014/055913
§ 371 (c)(1),
(2) Date: Sep. 28, 2015

(87) PCT Pub. No.: WO2014/154662
PCT Pub. Date: Oct. 2, 2014

(65) Prior Publication Data
US 2016/0056607 A1    Feb. 25, 2016

(30) Foreign Application Priority Data

Mar. 28, 2013 (DE) .................. 10 2013 205 594

(51) Int. Cl.
*H01S 5/00* (2006.01)
*H01S 5/022* (2006.01)
*G02B 7/02* (2006.01)
*G02B 27/09* (2006.01)

(52) U.S. Cl.
CPC .......... *H01S 5/02252* (2013.01); *G02B 7/025* (2013.01); *G02B 27/0966* (2013.01); *H01S 5/02272* (2013.01); *H01S 5/02288* (2013.01); *H01S 5/02208* (2013.01)

(58) Field of Classification Search
CPC .......... H01S 5/02252; H01S 5/02272; H01S 5/02288; H01S 5/02208
USPC ...................................... 372/44.01
See application file for complete search history.

(56) References Cited

U.S. PATENT DOCUMENTS

| 4,983,009 A | 1/1991 | Musk |
| 5,715,264 A | 2/1998 | Patel et al. |
| 5,825,054 A * | 10/1998 | Lee .............. H01L 33/483 257/675 |

(Continued)

FOREIGN PATENT DOCUMENTS

| DE | 197 06 279 A1 | 8/1998 |
| DE | 10 2004 004 738 A1 | 7/2005 |

(Continued)

OTHER PUBLICATIONS

Notice of Reasons for Rejection dated Aug. 23, 2016, of corresponding Japanese Application No. 2016-504626 in English.

*Primary Examiner* — Kinam Park
(74) *Attorney, Agent, or Firm* — DLA Piper LLP (US)

(57) ABSTRACT

A laser component includes a carrier having a lens carrier surface and a chip carrier surface raised relative to the lens carrier surface, wherein an optical lens is arranged on the lens carrier surface, a laser chip is arranged on the chip carrier surface, the chip carrier surface and the lens carrier surface are formed by materially uniformly continuous sections of the carrier, the carrier includes a plastic material, and the laser component is configured as a surface-mountable SMD component.

12 Claims, 6 Drawing Sheets

(56) References Cited

U.S. PATENT DOCUMENTS

| | | | |
|---|---|---|---|
| 5,838,703 A * | 11/1998 | Lebby | H01S 5/02288 |
| | | | 372/101 |
| 5,888,841 A | 3/1999 | Synder | |
| 6,135,645 A | 10/2000 | Grötsch | |
| 6,160,672 A | 12/2000 | Chan et al. | |
| 7,329,056 B2 * | 2/2008 | Sherrer | G02B 6/4201 |
| | | | 385/88 |
| 2002/0191655 A1 | 12/2002 | Heck et al. | |
| 2003/0161371 A1 | 8/2003 | Althaus et al. | |
| 2004/0232435 A1 | 11/2004 | Hofer et al. | |
| 2005/0161813 A1 * | 7/2005 | Pammer | H01L 33/62 |
| | | | 257/737 |
| 2006/0072883 A1 | 4/2006 | Kilian et al. | |
| 2009/0246898 A1 | 10/2009 | Steegmuller et al. | |
| 2012/0033695 A1 | 2/2012 | Hayashi et al. | |
| 2012/0213239 A1 | 8/2012 | Ju et al. | |

FOREIGN PATENT DOCUMENTS

| | | |
|---|---|---|
| DE | 10 2007 001 667 A1 | 11/2007 |
| JP | 55-132092 | 10/1980 |
| JP | 56-26483 | 3/1981 |
| JP | 57-078663 | 5/1982 |
| JP | 3-34387 | 2/1991 |
| JP | 2006-514434 | 4/2006 |
| JP | 2009-522757 | 6/2009 |

* cited by examiner

LASER COMPONENT AND METHOD FOR THE PRODUCTION THEREOF

TECHNICAL FIELD

This disclosure relates to a laser component and a method of producing a laser component.

German priority application DE 10 2013 205 594.3, which expressly forms a part of the disclosure of the present application, likewise describes a laser component and a method of producing a laser component.

BACKGROUND

Edge-emitting laser chips are known. Such laser chips have a relatively large beam divergence in a spatial direction (fast axis) oriented perpendicularly to the emission direction. For many applications, it is necessary to collect the laser radiation emitted by the laser chip by a collimation lens. In that case, it is necessary for the laser beam emitted by the laser chip to strike an optical axis of the lens as accurately as possible. A lens radius is then generally greater than a height of the edge-emitting laser chip. For this reason, the laser chip must be arranged raised relative to the collimation lens. In known integrated laser components (laser packages) comprising a laser chip and a collimation lens, to this end the laser chip is arranged on a separately produced base (submount). However, the production and additional process step necessary to mount the base lead to an increase in the production costs of such laser components.

It could therefore be helpful to provide a laser component and a method of producing a laser component.

SUMMARY

I provide a laser component including a carrier having a lens carrier surface and a chip carrier surface raised relative to the lens carrier surface, wherein an optical lens is arranged on the lens carrier surface, a laser chip is arranged on the chip carrier surface, the chip carrier surface and the lens carrier surface are formed by materially uniformly continuous sections of the carrier, the carrier comprises a plastic material, and the laser component is configured as a surface-mountable SMD component.

I further provide a method of producing a laser component including forming a carrier having a lens carrier surface and a chip carrier surface raised relative to the lens carrier surface by an injection molding method; forming a metallization on the chip carrier surface, wherein formation of the carrier and formation of the metallization are carried out according to an MID method; arranging a laser chip on the chip carrier surface; and arranging an optical lens on the lens carrier surface.

LIST OF REFERENCES 10 first laser component
20 second laser component
30 third laser component
100 carrier
110 lens carrier surface
120 chip carrier surface
130 end surface
140 front outer side
150 rear outer side
160 lower side
170 first metallization
171 first section
172 second section
173 third section
174 fourth section
175 fifth section
180 second metallization
181 first section
182 second section
183 third section
190 first solder contact surface
195 second solder contact surface
200 laser chip
201 upper side
202 lower side
203 emission side
210 first fastening material
220 bonding wire
230 divergent beam
300 biconvex cylindrical lens
310 second fastening material
320 collimated beam
400 planoconvex cylindrical lens
410 plane side
420 convex side
500 carrier
510 pedestal
520 cover bearing surface
600 cover
610 transparent section

DETAILED DESCRIPTION

My laser component comprises a carrier having a lens carrier surface and a chip carrier surface raised relative to the lens carrier surface. An optical lens is arranged on the lens carrier surface. A laser chip is arranged on the chip carrier surface. The chip carrier surface and the lens carrier surface are formed by materially uniformly continuous sections of the carrier. The carrier comprises a plastic material. In this laser component, the laser chip is advantageously arranged raised relative to the optical lens so that a laser beam emitted by the laser chip can strike an optical axis of the optical lens, even if the optical lens has a radius greater than a height of the laser chip. Owing to the materially uniformly continuous one-piece configuration of the carrier, it can be produced economically. An additional base for the raised arrangement of the laser chip is advantageously not necessary. Advantageously, therefore, tolerances due to such a base are also not incurred. The one-piece configuration of the carrier advantageously additionally simplifies mounting of the laser component. Formation of the carrier from a plastic material makes it possible to produce the carrier by a method of MID (molded interconnect device) technology. The optical lens may advantageously be a commercially available standard part.

The laser component may be configured as a surface-mountable SMD component. This advantageously allows surface mounting of the laser component, for example, using reflow soldering.

In one example of the laser component, the chip carrier surface and the lens carrier surface are oriented parallel to one another. Advantageously, the mutual alignment of the laser chip and the optical lens therefore becomes particularly simple.

The chip carrier surface and the lens carrier surface may be connected to one another by an end surface oriented perpendicularly to the chip carrier surface. Advantageously, the carrier of the laser component therefore has a particularly simple geometry.

The optical lens may bear on the end surface. Advantageously, the end surface can therefore be used during mounting of the laser component as a reference stop edge for precise passive alignment of the optical lens. Mounting the laser component is therefore advantageously simplified. Furthermore, mounting the laser component and mutual alignment of the parts of the laser component are therefore possible with particularly high accuracy.

The optical lens may be configured as a planoconvex cylindrical lens. Advantageously, the optical lens can therefore be aligned particularly simply with the end surface of the laser component. Furthermore, an optical lens configured as a planoconvex cylindrical lens advantageously has compact external dimensions.

The optical lens may be configured as a biconvex cylindrical lens. Advantageously, the optical lens can then lead to particularly strong beam collimation of a laser beam emitted by the laser chip, and can therefore compensate even for a large divergence of the laser beam.

The chip carrier surface may comprise a first metallization electrically conductively connected to a first solder contact surface of the carrier. Advantageously, an electrical contact of the laser chip may then electrically conductively connect to the first metallization. The laser chip of the laser component may then be electrically contacted via the first solder contact surface. For example, the laser component may be configured as a surface-mountable SMD component, which may, for example, be contacted by reflow soldering.

The lens carrier surface may comprise a metallization electrically conductively connected to the first metallization. Advantageously, the first metallization then electrically conductively connects to the first solder contact surface via a metallization extending over an outer side of the carrier so that the laser component can be produced particularly simply and economically.

The chip carrier surface may comprise a second metallization electrically conductively connected to a second solder contact surface of the carrier. Advantageously, an electrical contact of the laser chip can then electrically conductively connect to the second metallization. The laser chip of the laser component can then be electrically contacted via the second solder contact surface and the second metallization. For example, the laser component may be configured as a surface-mountable SMD component which may, for example, be contacted by reflow soldering.

The laser component may comprise a cover. In this case, the laser chip and the optical lens are arranged between the carrier and the cover. Advantageously, the laser chip and the optical lens are protected against mechanical damage by the cover. In this way, the laser component can advantageously be simply and economically mounted in an automated fashion by a pick-and-place method.

The cover is at least locally transparent for laser radiation emitted by the laser chip. Advantageously, the cover therefore causes only minor absorption of laser radiation emitted by the laser chip so that only small losses are incurred.

A method of producing a laser component comprises steps of forming a carrier having a lens carrier surface and a chip carrier surface raised relative to the lens carrier surface by an injection molding method, arranging a laser chip on the chip carrier surface, and arranging an optical lens on the lens carrier surface. Advantageously, this method can be carried out simply and economically. By virtue of the one-piece configuration of the carrier with the lens carrier surface and the chip carrier surface, no additional working step for the arrangement of a base to accommodate the laser chip is necessary. The arrangement of the laser chip and the optical lens can advantageously be carried out by conventional standard processes. In the laser component which can be obtained by the method, the laser chip is advantageously arranged raised relative to the optical lens so that a laser beam emitted by the laser chip can strike an optical axis of the optical lens even if the lens is configured with a radius greater than a height of the laser chip.

The carrier may be configured with an end surface oriented perpendicularly to the chip carrier surface and connects the chip carrier surface to the lens carrier surface. In this case, the optical lens is arranged bearing on the end surface. Advantageously, in this way the optical lens can be positioned with little outlay with high precision relative to the carrier. In this way, precise orientation of the optical lens relative to the laser chip can advantageously also be obtained so that the laser component which can be obtained by the method can have a high quality of the optical properties.

The method may comprise a further step of forming a metallization on the chip carrier surface. Advantageously, the metallization may be used for electrical connection of the laser chip so that the electrical connection of the laser chip can be configured particularly simply.

Formation of the carrier and formation of the metallization may be carried out according to an MID method. Advantageously, such method of MID (molded interconnect device) technology allows simple and economical mass production and offers great freedom in the selection of the geometry of the carrier and the metallization.

The method may comprise a further step of arranging a cover on the carrier. In this case, the laser chip and the optical lens are enclosed between the carrier and the cover. Advantageously, the laser chip and the optical lens are protected against mechanical damage by being enclosed under the cover. The laser component which can be obtained by the method is therefore suitable for automated mounting by a pick-and-place method.

The above-described properties, features and advantages, as well as the way in which they are achieved, will become more clearly and comprehensively understandable in connection with the following description of examples, which will be explained in more detail in connection with the drawings.

Figure 1:
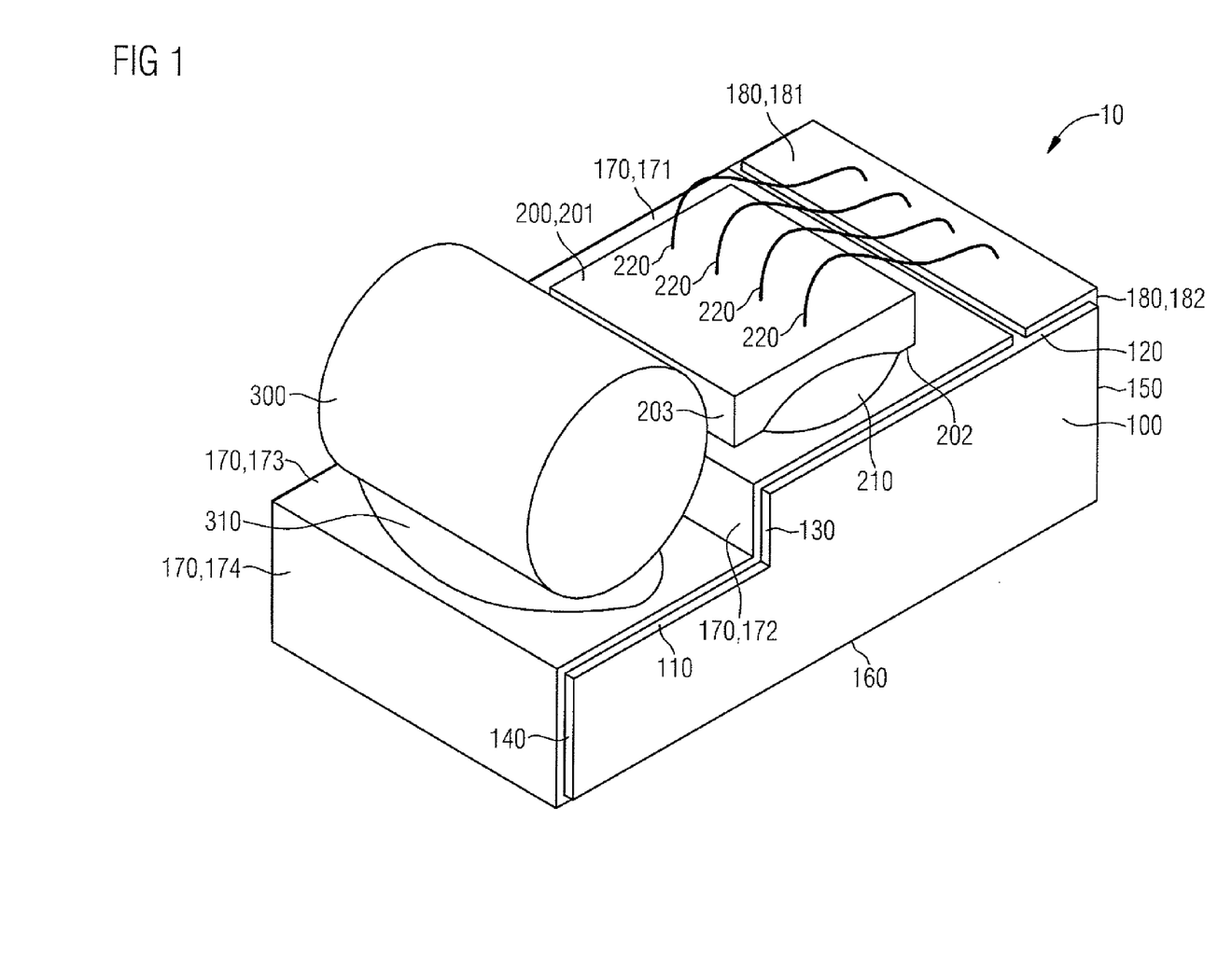
FIG. 1 shows a perspective view of a first laser component.
Figure 2:
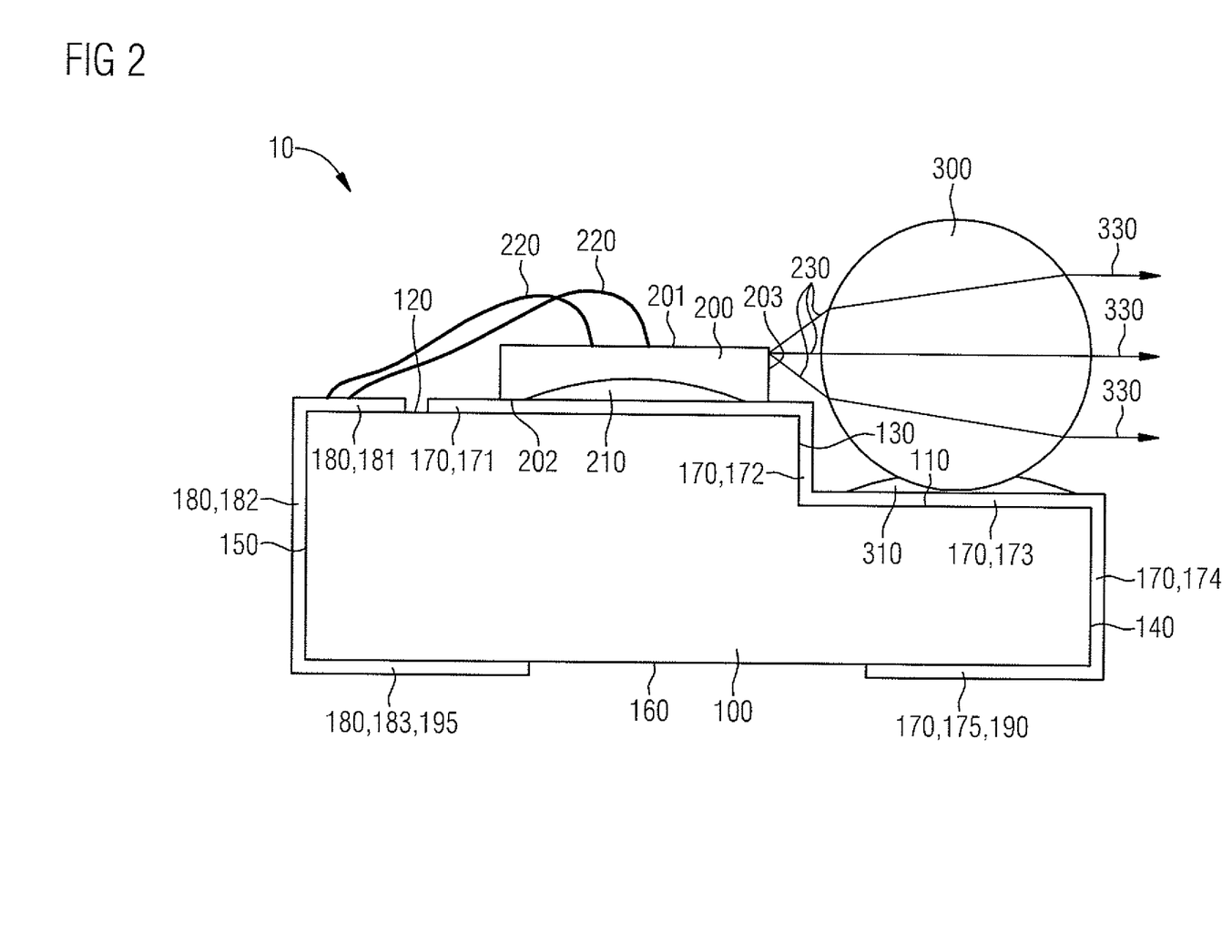
FIG. 2 shows a partially sectional side view of the first laser component.

FIG. 1 shows a slightly schematized perspective representation of a first laser component 10. FIG. 2 shows a partially sectional schematic side view of the first laser component 10. The first laser component 10 may also be referred to as a laser package.

The first laser component 10 comprises a carrier 100. The carrier 100 may be fabricated by a method of MID (molded interconnect device) technology. The carrier 100 comprises an electrically insulating body produced, for example, by an injection molding method or another molding method which, for example, comprises a plastic material in particular, for example, a polyphthalamide (PPA). The body of the carrier 100 is metallized on a plurality of its outer sides, for example, by an electrolytic method. Application of the metallization may, for example, be carried out in a process comprising a plurality of substeps. In this case, the electrically insulating body of the carrier 100 is metallized over its entire surface in a first step. The thin metallization is then removed in regions of the surface of the carrier 100 which are not intended to have any metallization. The remaining part of the metallization is thickened in a third step, for example, by an electrolytic method.

The carrier 100 of the first laser component 10 has a lens carrier surface 110 and a chip carrier surface 120. The lens carrier surface 110 and the chip carrier surface 120 are oriented parallel to one another. The chip carrier surface 120 is raised relative to the lens carrier surface 110. The lens carrier surface 110 and the chip carrier surface 120 of the carrier 100 of the first laser component 10 are configured materially uniformly continuously.

The lens carrier surface 110 connects via an end surface 130 to the chip carrier surface 120. The end carrier surface 130 is oriented perpendicularly to the lens carrier surface 110 and to the chip carrier surface 120. The lens carrier surface 110, the chip carrier surface 120 and the end surface 130 respectively have a rectangular shape.

The carrier 100 furthermore has a front outer side 140 and a rear outer side 150. The front outer side 140 is oriented parallel to the end surface 130 and follows on from the lens carrier surface 110 at the opposite end of the lens carrier surface 110 from the end surface 130. The rear outer side 150 follows on from the chip carrier surface 120 at the end facing away from the end surface 130 and is oriented perpendicularly to the chip carrier surface 120. The carrier 100 furthermore has a lower side 160. The lower side 160 is arranged parallel to the chip carrier surface 120 and to the lens carrier surface 110, but faces in a spatial direction opposite the spatial direction in which the lens carrier surface 110 and the chip carrier surface 120 face. The front outer side 140 connects the lower side 160 to the lens carrier surface 110. The rear outer side 150 connects the lower side 160 to the chip carrier surface 120.

The carrier 100 has a first metallization 170. The first metallization 170 comprises an electrically conductive material. The first metallization 170 may have been applied by the above-described method of MID (molded interconnect device) technology. The first metallization 170 comprises a first section 171 arranged on the lens carrier surface 110, a second section 172 extending over the end surface 130, a third section 173 arranged on the lens carrier surface 110, a fourth section 174 extending over the front outer side 140, and a fifth section 175 arranged on the lower side 160 of the carrier 100. The sections 171, 172, 173, 174, 175 of the first metallization 170 are configured continuously and form an uninterrupted electrically conductive connection. The fifth section 175 of the first metallization 170 forms a first solder contact surface 190 of the first laser component 10.

It is also possible to configure the first metallization 170 differently than as represented in the example of FIGS. 1 and 2. What is essential is merely that the first metallization 170 comprises the first section 171 arranged on the chip carrier surface 120 and the fifth section 175, arranged on the lower side 160, which forms the first solder contact surface 190. The first section 171 and the fifth section 175 of the first metallization 170 must be electrically conductively connected to one another. The electrically conductive connection between the first section 171 and the fifth section 175 of the first metallization 170 need not, however, necessarily extend over the end surface 130, the lens carrier surface 110 and the front outer side 140 of the carrier 100.

The carrier 100 furthermore has a second metallization 180. The second metallization 180 comprises an electrically conductive material. The second metallization 180 may have been applied by the above-described method of MID (molded interconnect device) technology. The second metallization 180 comprises a first section 181 arranged on the chip carrier surface 120 of the carrier 100, a second section 182 extending over the rear outer side 150, and a third section 183 arranged on the lower side 160 of the carrier 100. The sections 181, 182, 183 of the second metallization 180 electrically conductively connect to one another. The third section 183 of the second metallization 180 forms a second solder contact surface 195. The first section 181 and the third section 183 of the second metallization 180 may also electrically conductively connect to one another other than via the second section 182 extending over the rear outer side 150. The first metallization 170 and the second metallization 180 are electrically insulated from one another.

The first solder contact surface 190 and the second solder contact surface 195 on the lower side 160 of the carrier 100 of the first laser component 10 are suitable for electrical connection of the first laser component 10 by a method of surface-mount technology (SMT method). For example, the first solder surface 190 and the second solder surface 195 may be electrically contacted by reflow soldering. The first laser component 10 therefore forms a surface-mountable SMD (surface-mounted device) component.

A laser chip 200 is arranged on the first section 171 of the first metallization 170 on the chip carrier surface 120 of the carrier 100 of the first laser component 10. The laser chip 200 is a semiconductor laser chip. The laser chip 200 has an upper side 201 and a lower side 202 opposite the upper side 201.

An electrical contact that electrically contacts the laser chip 200 is respectively arranged on the upper side 201 and on the lower side 202 of the laser chip 200. The lower side 202 of the laser chip 200 faces toward the chip carrier surface 120 and connects to the first section 171 of the first metallization 170 by an electrically conductive first fastening material 210. The first fastening material 210 produces an electrically conductive connection between the first metallization 170 and the electrical contact arranged on the lower side 202 of the laser chip 200. The first fastening material 210 may, for example, be a conductive adhesive. Preferably, the first fastening material 210 is configured to be so high thermally stable that it withstands without damage a temperature occurring during surface mounting of the first laser component 10 by reflow soldering. The laser chip 200 may have been fastened on the first section 171 of the first metallization 170 on the chip carrier surface 120 by a conventional die bonding method.

The electrical contact of the laser chip 200, arranged on the upper side 201 of the laser chip 200, electrically conductively connects by a plurality of bonding wires 220 to the first section 181 of the second metallization 180 on the chip carrier surface 120 of the carrier 100. The bonding wires 220 may have been arranged by a conventional wire bonding method.

The laser chip 200 has an emission side 203 formed by a side surface of the laser chip 200, connecting the upper side 201 to the lower side 202. The laser chip 200 is configured to emit a laser beam on its emission side 203. The laser chip 200 is in this case configured as an edge emitter. The emission of the laser radiation takes place on the emission side 203, close to the upper side 201 of the laser chip 200.

The first laser component 10 furthermore has a biconvex cylindrical lens 300. The biconvex cylindrical lens 300 is an imaging optical lens. The biconvex cylindrical lens 300 consists of a material which is transparent for laser radiation emitted by the laser chip 200. In the example represented, the biconvex cylindrical lens 300 has a circular cylindrical shape with a circular disk-shaped cross section. The biconvex cylindrical lens 300 could, however, also have a different biconvex cross section.

The longitudinal axis of the biconvex cylindrical lens 300 is oriented parallel to the connecting edge between the end surface 130 and the chip carrier surface 120 of the carrier 100. The biconvex cylindrical lens 300 is arranged on the lens carrier surface 110 and is fastened by a second fastening material 310. The second fastening material 310 may, for example, be an adhesive. Preferably, the second fastening material 310 is configured to be so high thermally stable that it withstands without damage a temperature occurring during surface mounting of the first laser component 10 by reflow soldering. The biconvex cylindrical lens 300 may have been arranged on the lens carrier surface 110 by a conventional method.

The emission side 203 of the laser chip 200 faces toward the biconvex cylindrical lens 300. The height difference between the chip carrier surface 120 and the lens carrier surface 110 of the carrier 100, the thickness of the laser chip 200 between its lower side 202 and its upper side 201 as well as the diameter of the biconvex cylindrical lens 300, are matched to one another such that a laser beam emitted on the emission side 203 of the laser chip 200 during operation of the laser component 10 strikes the biconvex cylindrical lens 300 at the height of the optical axis of the biconvex cylindrical lens 300. The laser beam emitted by the laser chip 200 emerges from the laser chip 200 as a divergent beam 230. The divergent beam 230 strikes the biconvex cylindrical lens 300 and is concentrated by the latter in a plane oriented perpendicularly to the longitudinal axis of the biconvex cylindrical lens 300 to form a collimated beam 330, which emerges from the biconvex cylindrical lens 300 as a parallel beam.

During the mounting of the biconvex cylindrical lens 300 on the lens carrier surface 110 of the carrier 100 of the first laser component 10, the end surface 130 and/or the edge between the end surface 130 and the chip carrier surface 120 may be used as a reference for alignment of the biconvex cylindrical lens 300. For example, the biconvex cylindrical lens 300 may be arranged in abutment with the end surface 130 or the edge between the end surface 130 and the chip carrier surface 120 on the lens carrier surface 110. The biconvex cylindrical lens 300 may, however, as represented in FIGS. 1 and 2, also be arranged at a distance from the end surface 130 on the lens carrier surface 110.

The carrier 100 of the first laser component 10 may, for example, have a length of 3.5 mm between its front outer side 140 and its rear outer side 150. In the direction transverse thereto, the carrier 100 may, for example, have a width of 2 mm. The laser chip 200 may, for example, have an edge length of 600 µm.

Figure 3:
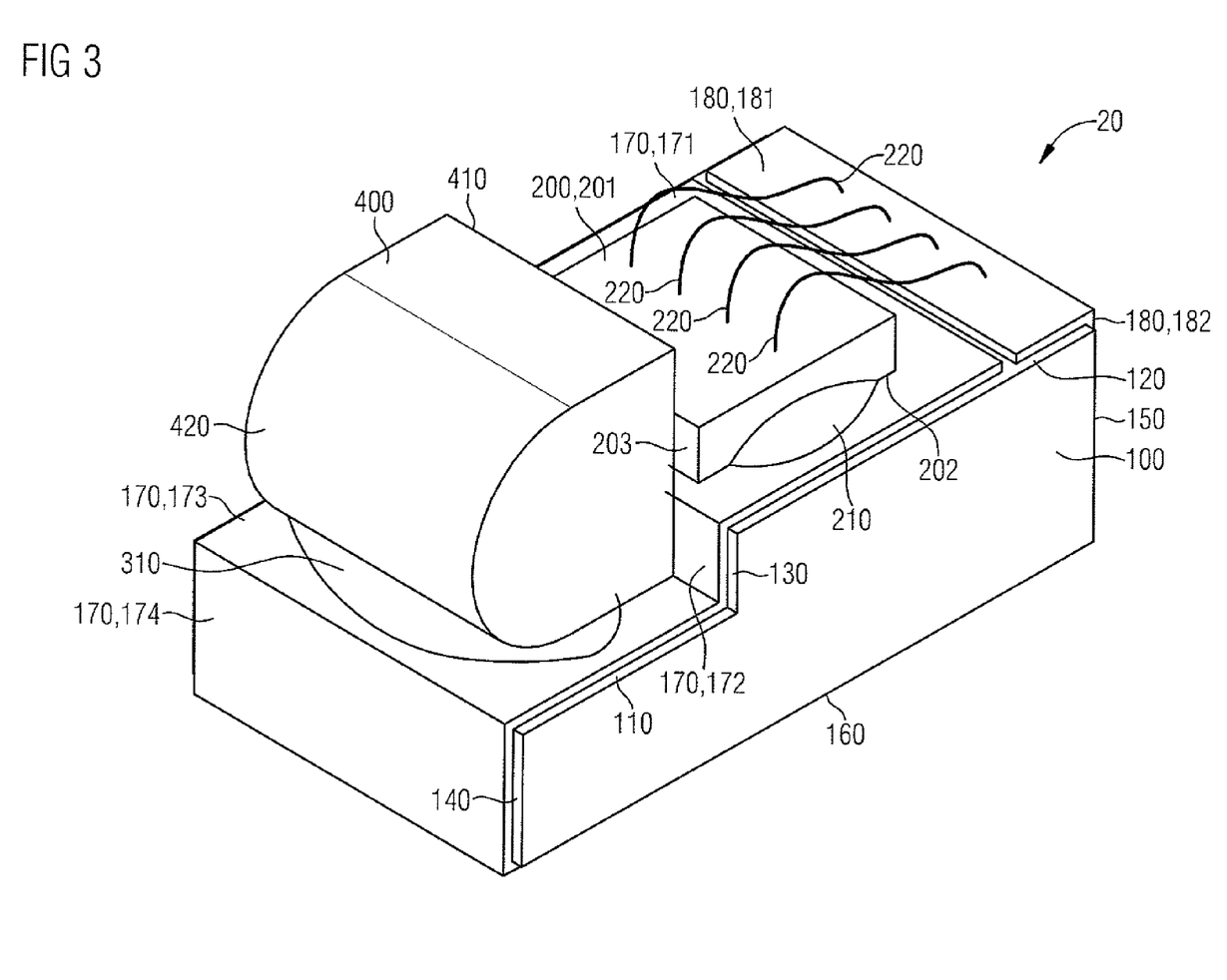
FIG. 3 shows a perspective view of a second laser component.
Figure 4:
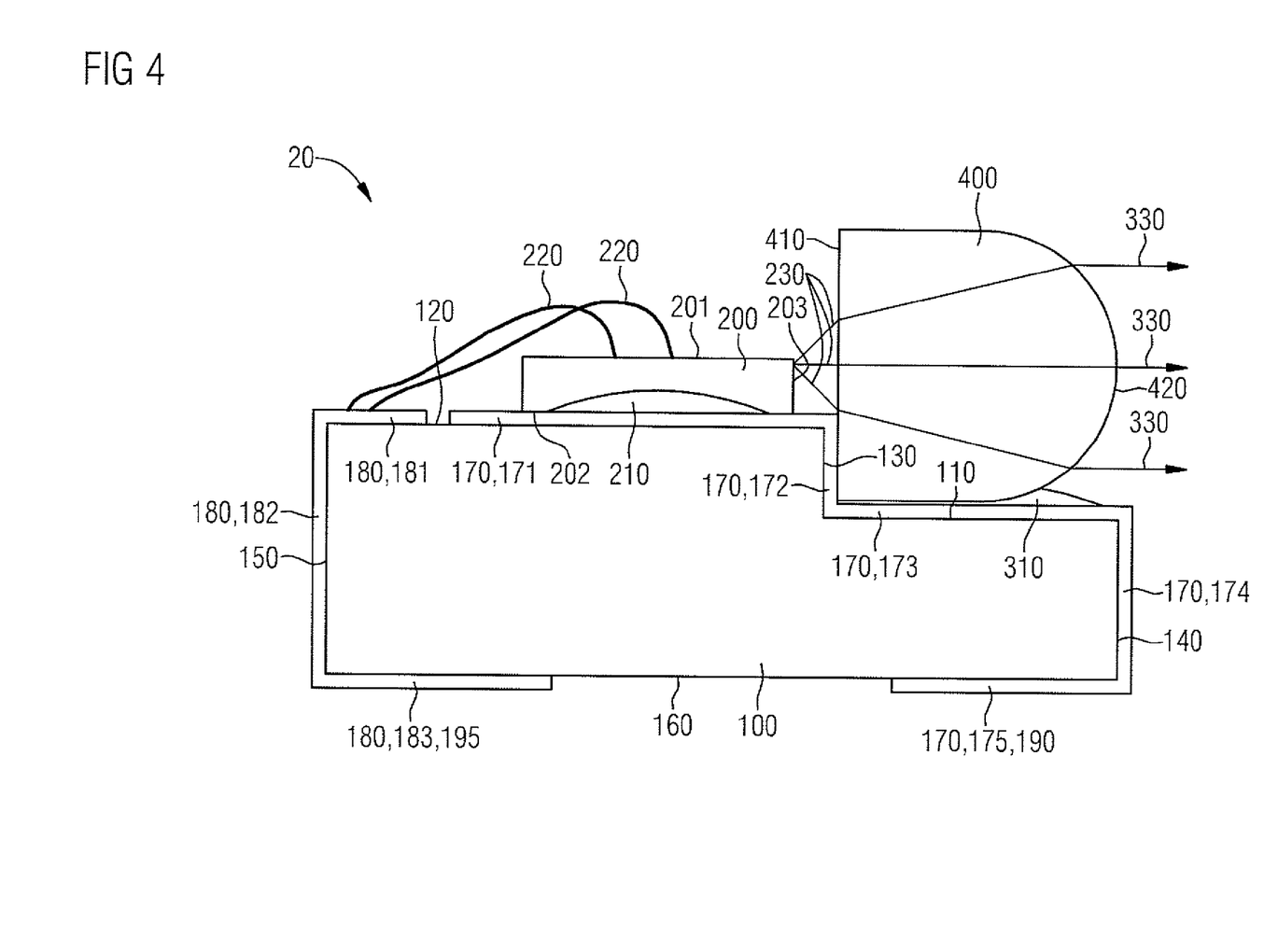
FIG. 4 shows a partially sectional side view of the second laser component.

FIG. 3 shows a schematic perspective representation of a second laser component 20. FIG. 4 shows a partially sectional schematic side view of the second laser component 20. The second laser component 20 has large correspondences with the first laser component 10 of FIGS. 1 and 2. Corresponding parts are provided with the same references in FIGS. 3 and 4 as in FIGS. 1 and 2, and will not be described again in detail below.

In contrast to the first laser component 10, the second laser component 20 has a planoconvex cylindrical lens 400 instead of the biconvex cylindrical lens 300. The planoconvex cylindrical lens 400 is configured cylindrically and has a planoconvex cross section with a plane side 410 and a convex side 420. The planoconvex cylindrical lens 400 may, for example, have an approximately semicircular disk-shaped cross section.

The planoconvex cylindrical lens 400 is fastened on the lens carrier surface 110 of the second laser component 20 by a second fastening material 310. The mounting of the planoconvex cylindrical lens 400 on the lens carrier surface 110 of the carrier 100 may be carried out by a conventional standard method. The plane side 410 of the planoconvex cylindrical lens 400 bears on the end surface 130 of the carrier 100. The end surface 130 has been used as mechanical stop for the adjustment of the planoconvex cylindrical lens 400 during the mounting of the planoconvex cylindrical lens 400. It is, however, also possible to arrange the planoconvex lens 400 at a distance from the end surface 130 on the lens carrier surface 110 of the carrier 100.

The planoconvex cylindrical lens 400 of the second laser component 20 is used, like the biconvex cylindrical lens 300 of the first laser component 10, to concentrate a divergent laser beam 230 emitted by the laser chip 200 to form a collimated beam 330. The divergent beam 230 emerging from the emission side 203, facing toward the plane side 410 of the planoconvex cylindrical lens 400, of the laser chip 200 strikes the plane side 410 of the planoconvex cylindrical lens 400 and leaves the planoconvex cylindrical lens 400 as a collimated beam 330 on the convex side 420 of the planoconvex cylindrical lens 400.

Figure 5:
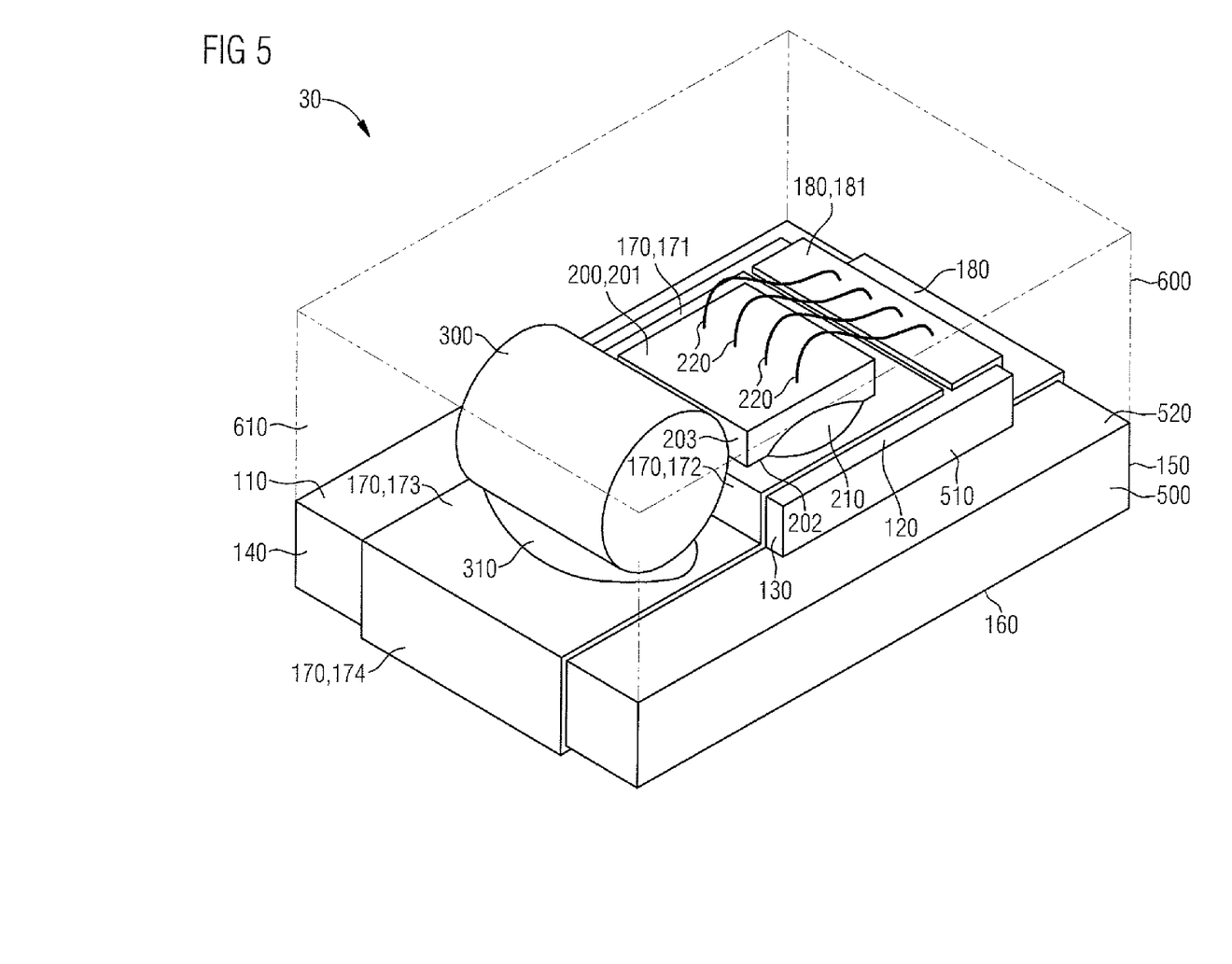
FIG. 5 shows a perspective view of a third laser component.
Figure 6:
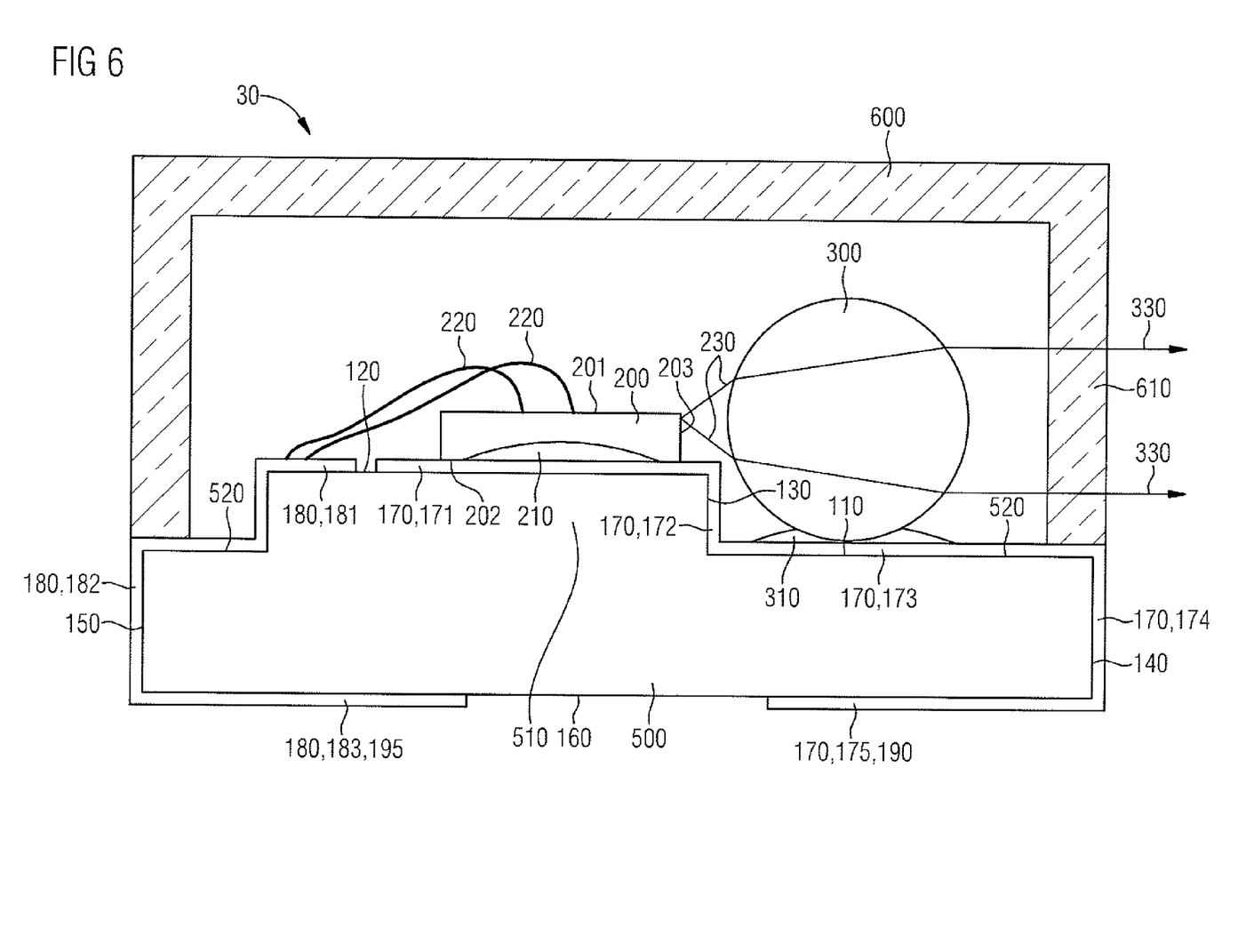
FIG. 6 shows a partially sectional side view of the third laser component.

FIG. 5 shows a schematic perspective representation of a third laser component 30. FIG. 6 shows a partially sectional schematic side view of the third laser component 30. The third laser component 30 has large correspondences with the first laser component 10 of FIGS. 1 and 2. Corresponding parts are provided with the same references in FIGS. 5 and 6 as in FIGS. 1 and 2, and will not be described again in detail below.

In contrast to the first laser component 10, the third laser component 30 has a carrier 500 instead of the carrier 100. In correspondence with the carrier 100, the carrier 500 has a lens carrier surface 110 and a chip carrier surface 120 raised relative to the lens carrier surface 110.

A cover bearing surface 520 is formed circumferentially around the lens carrier surface 110 and the raised chip carrier surface 120. The cover bearing surface 520 has the same level as the lens carrier surface 110. The raised chip carrier surface 120 is arranged on a pedestal 510 elevated relative to the lens carrier surface 110 and the cover bearing surface 520. An end surface 130 of the pedestal 510 is oriented perpendicularly to the lens carrier surface 110 and to the chip carrier surface 120, and connects the lens carrier surface 110 to the chip carrier surface 120. The end surface 130 forms a side surface of the pedestal 510. The pedestal 510 is formed in one piece with the remaining parts of the carrier 500. In this way, the lens carrier surface 100 and the chip carrier surface 120 of the carrier 500 of the third laser component 30 are configured materially uniformly continuously.

Again, sections 171, 172, 173, 174, 175 of a first metallization 170 extend from the chip carrier surface 120 to a lower side 160 of the carrier 500. The fifth section 175 of the first metallization 170 forms on the lower side 160 of the carrier 500 a first solder contact surface 190. A second metallization 180 extends from the chip carrier surface 120 to the lower side 160 of the carrier 500. A third section 183 of the second metallization 180 forms on the lower side 160 of the carrier 500 a second solder contact surface 195. The first metallization 170 and the second metallization 180 are electrically insulated from one another. The precise configuration of the metallizations 170, 180 may again differ from the example represented.

The first solder contact surface 190 and the second solder contact surface 195 are suitable for electrical connection of the third laser component 30 by a surface-mount method, for example, by reflow soldering. The third laser component 30 therefore forms a surface-mountable SMD (surface-mounted device) component.

As in the first laser component 10, in the third laser component 30 a laser chip 200 is arranged on the chip carrier surface 120 and is electrically coupled to the first metallization 170 and the second metallization 180. Furthermore, a biconvex cylindrical lens 300 is arranged on the lens carrier surface 110.

The third laser component 30 comprises a cover 600. The cover 600 is arranged above the carrier 500 and encloses the laser chip 200 and the biconvex cylindrical lens 300 between the cover 600 and the carrier 500. The cover 600 in this case bears on the cover bearing surface 520 of the carrier 500.

The cover 600 may, for example, be fastened on the cover bearing surface 520 of the carrier 500 by an epoxide-based thermally and/or UV-curing adhesive. The adhesive is preferably configured to be so high thermally stable that it withstands without damage a temperature occurring during surface mounting of the third laser component 30 by reflow soldering and operating temperatures occurring during operation of the third laser component 30. Preferably, the adhesive withstands temperature cycles of −40° C. to 125° C. Particularly preferably, the adhesive is thermally stable up to a temperature of at least 260° C. The adhesive may, for example, comprise the material DELO AD762.

The cover 600 has a transparent section 610, which is essentially transparent for laser radiation emitted by the laser chip 200. The transparent section 610 is arranged such that a collimated beam 330 leaving the biconvex cylindrical lens 300 can pass through the transparent section 610 of the cover 600 and leave the third laser component 30. The cover 600 may also be entirely made of a material which is transparent for laser radiation emitted by the laser chip 200.

Preferably, the transparent section 610 of the cover 600 is transparent for light in the near infrared range with a wavelength of about 800 nm to 1000 nm. For example, the transparent section 610 of the cover 600 may have a transparency of more than 75% at a wavelength of 850 nm.

The material of the cover 600 is preferably configured to be high thermally stable so that it withstands without damage a temperature occurring during surface mounting of the third laser component 30 by reflow soldering. Preferably, the material is thermally stable up to a temperature of at least 260° C.

The material of the cover 600 is preferably moldable by a suitable method. The cover 600 may, for example, comprise the material Sabic Extem XH1015.

The laser chip 200 and the biconvex cylindrical lens 300 of the third laser component 30 are protected against mechanical damage by the cover 600. The third laser component 30 is therefore suitable for automated handling. For example, the third laser component 30 may be arranged on a circuit carrier by an automated pick-and-place method.

Instead of the biconvex cylindrical lens 300, the third laser component 30 may also have a planoconvex cylindrical lens 400 like the second laser component 20. The biconvex cylindrical lenses 300 and planoconvex cylindrical lenses 400 of all the laser components 10, 20, 30 may also be replaced with other optical lenses.

As an alternative to the provision of the cover 600, the laser chip 200 and the bonding wires 220 in the third laser component 30 could also be embedded in a transparent encapsulation. In this case, the encapsulation would preferably also fill the gap between the laser chip 200 and the biconvex cylindrical lens 300. The encapsulation could, for example, comprise a transparent epoxide or a transparent silicone.

My components and methods have been illustrated and described in detail with the aid of the preferred examples. The disclosure is not, however, restricted to the examples disclosed. Rather, other variants may be derived therefrom by those skilled in the art, without departing from the protective scope of this disclosure.

The invention claimed is:

1. A laser component comprising:
   a carrier having a lens carrier surface and a chip carrier surface raised relative to the lens carrier surface,
   wherein an optical lens is arranged on the lens carrier surface,
   a laser chip is arranged on the chip carrier surface,
   the chip carrier surface and the lens carrier surface are formed by materially uniformly continuous sections of the carrier,
   the carrier comprises a plastic material, and
   the laser component is configured as a surface-mountable SMD component.

2. The laser component as claimed in claim 1, wherein the chip carrier surface and the lens carrier surface connect to one another by an end surface oriented perpendicularly to the chip carrier surface.

3. The laser component as claimed in claim 2, wherein the optical lens bears on the end surface.

4. The laser component as claimed in claim 1, wherein the optical lens is a planoconvex cylindrical lens.

5. The laser component as claimed in claim 1, wherein the optical lens is a biconvex cylindrical lens.

6. The laser component as claimed in claim 1, wherein the chip carrier surface comprises a first metallization electrically conductively connected to a first solder contact surface of the carrier.

7. The laser component as claimed in claim 6, wherein the lens carrier surface comprises a metallization electrically conductively connected to the first metallization.

8. The laser component as claimed in claim 1, wherein the chip carrier surface comprises a second metallization electrically conductively connected to a second solder contact surface of the carrier.

9. The laser component as claimed in claim 1, wherein the laser component comprises a cover,
   the laser chip and the optical lens are arranged between the carrier and the cover, and
   the cover is at least locally transparent for laser radiation emitted by the laser chip.

10. A method of producing a laser component comprising:
    forming a carrier having a lens carrier surface and a chip carrier surface raised relative to the lens carrier surface by an injection molding method;

forming a metallization on the chip carrier surface, wherein formation of the carrier and formation of the metallization are carried out according to an MID method;

arranging a laser chip on the chip carrier surface; and arranging an optical lens on the lens carrier surface.

11. The method as claimed in claim 10, wherein the carrier is configured with an end surface oriented perpendicularly to the chip carrier surface and connects the chip carrier surface and the lens carrier surface to one another, and the optical lens is arranged bearing on the end surface.

12. The method as claimed in claim 10, further comprising:

arranging a cover on the carrier, wherein the laser chip and the optical lens are enclosed between the carrier and the cover.

* * * * *